(12) United States Patent
Myung et al.

(10) Patent No.: US 9,258,085 B2
(45) Date of Patent: Feb. 9, 2016

(54) APPARATUS AND METHOD FOR TRANSMITTING AND RECEIVING SIGNAL IN BROADCASTING AND COMMUNICATION SYSTEMS

(71) Applicant: Samsung Electronics Co., Ltd., Suwon-si, Gyeonggi-do (KR)

(72) Inventors: Seho Myung, Seoul (KR); Hong-Sil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/324,802

(22) Filed: Jul. 7, 2014

(65) Prior Publication Data

US 2015/0010117 A1 Jan. 8, 2015

(30) Foreign Application Priority Data

Jul. 8, 2013 (KR) ........................ 10-2013-0079732

(51) Int. Cl.
| | |
|---|---|
| *H04L 1/00* | (2006.01) |
| *H03M 13/00* | (2006.01) |
| *H04L 27/00* | (2006.01) |
| *H04L 27/34* | (2006.01) |
| *H03M 13/11* | (2006.01) |
| *H03M 13/25* | (2006.01) |

(52) U.S. Cl.
CPC ............. *H04L 1/0071* (2013.01); *H03M 13/00* (2013.01); *H03M 13/1171* (2013.01); *H03M 13/255* (2013.01); *H04L 1/007* (2013.01); *H04L 1/0041* (2013.01); *H04L 1/0054* (2013.01); *H04L 1/0058* (2013.01); *H04L 27/00* (2013.01); *H04L 27/34* (2013.01)

(58) Field of Classification Search
CPC ........ H04L 1/0058; H04L 1/007; H04L 27/00; H04L 1/0041; H04L 1/0045
See application file for complete search history.

(56) References Cited

U.S. PATENT DOCUMENTS

| | | | | |
|---|---|---|---|---|
| 4,896,353 | A * | 1/1990 | Dehgani et al. | 714/755 |
| 6,611,513 | B1 * | 8/2003 | ten Brink | 370/342 |
| 6,634,007 | B1 * | 10/2003 | Koetter et al. | 714/784 |
| 8,149,925 | B2 * | 4/2012 | Goldman et al. | 375/240.27 |
| 8,793,551 | B2 * | 7/2014 | Zhou et al. | 714/752 |
| 2004/0039983 | A1 * | 2/2004 | Brossier et al. | 714/758 |
| 2010/0183101 | A1 * | 7/2010 | Mundarath | H04L 1/0048 375/341 |
| 2010/0246719 | A1 * | 9/2010 | Ko et al. | 375/303 |
| 2011/0029845 | A1 * | 2/2011 | Zhou et al. | 714/776 |
| 2012/0254683 | A1 * | 10/2012 | Yang et al. | 714/752 |
| 2013/0148963 | A1 * | 6/2013 | Cvijetic et al. | 398/45 |
| 2014/0185657 | A1 * | 7/2014 | Arambepola et al. | 375/222 |

* cited by examiner

*Primary Examiner* — Jean B Corrielus
(74) *Attorney, Agent, or Firm* — Jefferson IP Law, LLP

(57) ABSTRACT

A method for transmitting a signal in broadcasting and communication systems is provided. The method includes dividing source data into two or more streams and respectively coding the two or more streams through coders, selecting two or more symbols from among coded codeword symbols, mapping the selected two or more symbols to one signal constellation for modulation, and transmitting a modulated signal, in which the codeword symbols include one or more non-binary codewords, and a product of orders of finite fields on which the codeword symbols are defined is equal to an order of the signal constellation.

18 Claims, 9 Drawing Sheets

APPARATUS AND METHOD FOR TRANSMITTING AND RECEIVING SIGNAL IN BROADCASTING AND COMMUNICATION SYSTEMS

CROSS-REFERENCE TO RELATED APPLICATION(S)

This application claims the benefit under 35 U.S.C. §119 (a) of a Korean patent application filed on Jul. 8, 2013 in the Korean Intellectual Property Office and assigned Serial number 10-2013-0079732, the entire disclosure of which is hereby incorporated by reference.

TECHNICAL FIELD

The present disclosure relates to an apparatus and method for transmitting and receiving a signal in a broadcasting or communication system. More particularly, the present disclosure relates to a method and apparatus for improving performance and flexibility of a system when a non-binary code is used as a channel code.

BACKGROUND

Next-generation communication systems need to maximize data rates thereof and meet various needs of users in an ever-changing channel environment. To this end, a need is being emphasized for channel codes having a strong error correction capability, thereby raising a performance level required for the channel codes.

A Low-Density Parity-Check (LDPC) code proposed by Gallager in 1962 is known as having superior performance that is close to a channel capacity of Shannon through repetitive decoding. However, for a binary LDPC code, a code length N has to be sufficiently long to obtain performance that is close to the channel capacity of Shannon. When an LDPC code is designed in a non-binary finite field, performance that is close to a channel capacity may be obtained for a relatively short length, and for a codeword length considered in an actual communication system, superior performance may be provided when compared to a binary LDPC code. As the non-binary LDPC code is known as providing better performance than a general binary LDPC coding scheme, the non-binary LDPC code is attracting much attention as one of channel codes suitable for next-generation communication systems.

A general non-binary coding scheme is configured to properly map one non-binary code to a signal constellation, thus maximizing performance. However, studies have not been conducted regarding a signal constellation mapping scheme when a plurality of coding schemes are used to support a service of various qualities.

Recently, various multimedia services are configured compositively, such that a number of attempts have been made to provide one new service. Because services need different qualities, research has been conducted to provide different robustness properties for different services. One of such methods for providing different qualities is to use a plurality of coding schemes. However, typically, one modulator and one demodulator are used for convenience of implementation in a system, such that for application of the plurality of encoding schemes to the system, a signal constellation mapping scheme suitable for the plurality of encoding schemes needs to be studied. In particular, as the non-binary encoding scheme has become important, a need is also increasing for studies on combining the non-binary encoding scheme with the signal constellation mapping scheme.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a channel encoding scheme and a modulation and demodulation method and apparatus to improve transmission efficiency without high decoding complexity.

Another aspect of the present disclosure is to provide a method and apparatus for efficiently reconstructing data in case of occurrence of data loss and distortion in a broadcasting or communication system.

Other objects to be provided in the present disclosure may be understood by embodiments described below.

In accordance with an aspect of the present disclosure, a method for transmitting a signal in broadcasting and communication systems is provided. The method includes dividing source data into two or more streams and respectively coding the two or more streams to codeword symbols, selecting two or more symbols from among the coded codeword symbols, modulating the selected two or more symbols by mapping the two or more selected symbols to one signal constellation for modulation, and transmitting a modulated signal, in which the codeword symbols include one or more non-binary codewords, and a product of orders of finite fields on which the codeword symbols are defined is equal to an order of the signal constellation.

In accordance with another aspect of the present disclosure, a method for receiving a signal in broadcasting and communication systems is provided. The method includes demodulating a received signal to calculate finite-field-symbol-wise Likelihood Ratio (LR) values or signal-constellation-specific reception probabilities and decoding the calculated values or probabilities to obtain codewords including at least one non-binary codeword, in which a product of orders of finite fields on which codeword symbols are defined is equal to an order of the signal constellation.

In accordance with another aspect of the present disclosure, an apparatus for transmitting a signal in broadcasting and communication systems is provided. The apparatus includes a coder configured to divide source data into two or more streams and to respectively code the two or more streams, and a signal constellation mapper configured to select two or more symbols from among coded codeword symbols, to modulate the selected two or more symbols by mapping the two or more selected symbols to one signal constellation for modulation, and to transmit a modulated signal, in which the codeword symbols include one or more non-binary codewords, and a product of orders of finite fields on which the codeword symbols are defined is equal to an order of the signal constellation.

In accordance with another aspect of the present disclosure, an apparatus for receiving a signal in broadcasting and communication systems is provided. The apparatus includes a signal constellation demapper configured to demodulate a received signal to calculate finite-field-symbol-wise LR values or signal-constellation-specific reception probabilities and a decoder configured to decode the calculated values or probabilities to obtain codewords including at least one non-binary codeword, in which a product of orders of finite fields on which codeword symbols are defined is equal to an order of the signal constellation.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
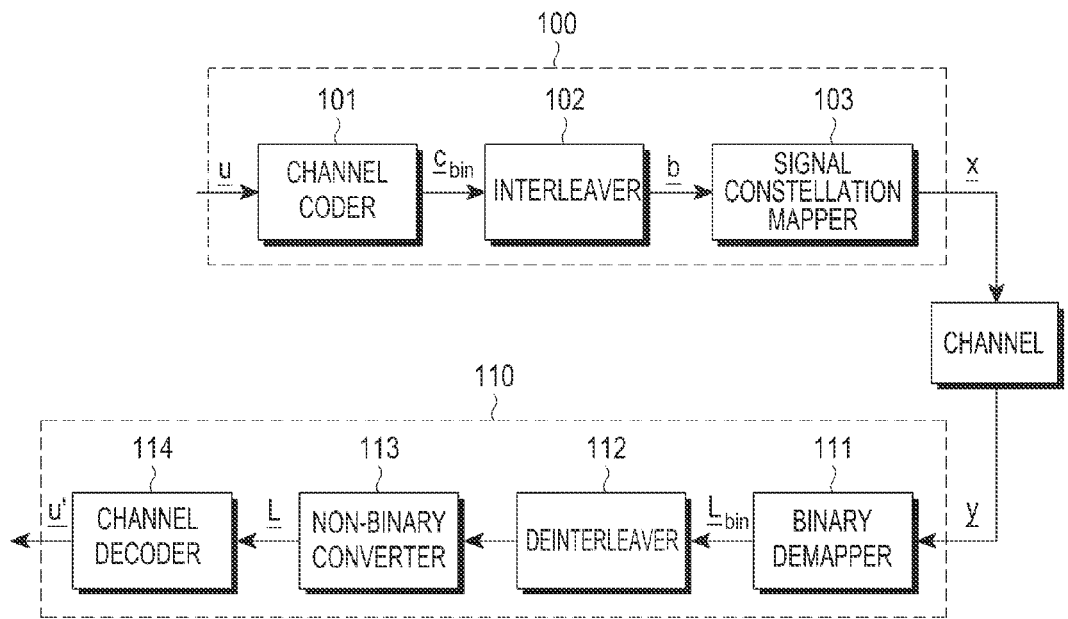
FIG. 1 is a schematic block diagram of a transmitter and a receiver according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to various embodiments of the present disclosure, an electronic device may include communication functionality. For example, an electronic device may be a smart phone, a tablet Personal Computer (PC), a mobile phone, a video phone, an e-book reader, a desktop PC, a laptop PC, a netbook PC, a Personal Digital Assistant (PDA), a Portable Multimedia Player (PMP), an mp3 player, a mobile medical device, a camera, a wearable device (e.g., a Head-Mounted Device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television, a Digital Video Disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., Magnetic Resonance Angiography (MRA) device, a Magnetic Resonance Imaging (MRI) device, Computed Tomography (CT) device, an imaging device, or an ultrasonic device), a navigation device, a Global Positioning System (GPS) receiver, an Event Data Recorder (EDR), a Flight Data Recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

Various embodiments of the present disclosure described below propose a method for efficiently recovering data loss and distortion in any electronic device which is capable of transmitting and receiving various multimedia services such as video conference/call as well as high-volume content such as High-Definition (HD) content Ultra High Definition (UHD) content, over a network. In particular, the present disclosure proposes a method for improving transmission efficiency without largely increasing decoding complexity when a high-order modulation scheme and a non-binary coding scheme are combined for application of a channel coding scheme to data. Although only non-binary parity check codes have been described for convenience in an embodiment of the present disclosure, the present disclosure is not limited to a specific non-binary coding scheme.

The parity check codes are typically defined as a parity-check matrix, and non-binary parity check codes may be defined as a parity-check matrix whose entries include not only 0 and 1, but also non-binary symbols. Herein, the non-binary symbols may be expressed as entries on a ring or a group as well as entries on a finite field or a Galois field.

Although non-binary parity check codes defined on a finite field will be described for convenience in various embodiments of the present disclosure, the present disclosure may be applied to non-binary parity check codes defined on a ring or a group without being limited to a finite field. Reed-Solomon (RS) codes and non-binary Low-Density Parity Codes (LDPCs) are well known non-binary parity check codes, but the present disclosure is not limited to particular error-correcting codes.

First, to describe a non-binary parity check code in more detail, an example of a parity check matrix H including entries $0, 1, \alpha$, and $\alpha^2$ on a finite field GF(4) is expressed as follows:

$$H = \begin{bmatrix} 1 & 1 & 1 & 0 & 1 & 0 & 0 \\ \alpha & \alpha^2 & 0 & 1 & 0 & 1 & 0 \\ \alpha^2 & 0 & \alpha & \alpha & 0 & 0 & 1 \end{bmatrix} \qquad \text{Equation (1)}$$

For convenience, let codewords of non-binary parity check codes defined based on Equation 1 be $\underline{c}=(c_0, c_1, c_2, c_3, c_4, c_5, c_6)$ ($c_n \in GF(4)$). Then, Equation 2 is established.

$$H \cdot \underline{c} = \begin{bmatrix} c_0 + c_1 + c_2 + c_4 \\ \alpha c_0 + \alpha^2 c_1 + c_3 + c_5 \\ \alpha^2 c_0 + \alpha c_2 + \alpha c_3 + c_6 \end{bmatrix} = \begin{bmatrix} 0 \\ 0 \\ 0 \end{bmatrix} = \underline{0}, \qquad \text{Equation (2)}$$

where any add and multiply operations are defined on the finite field GF(4).

Referring to Equation 2, each row of the parity check matrix H of Equation 1 corresponds to one parity-check equation. A value of each parity-check equation for a codeword $\underline{c}$ is 0 at all times.

Generally, let an M×N party-check matrix for a non-binary parity-check code defined on a finite field GF(Q) be H, and let a codeword having a length N be $\underline{c}=(c_0, c_1, \ldots, c_{N-1})$. Then, Equation 3 is satisfied as follows:

$$\sum_{n \in N(m)} H_{mn} c_n = 0, m = 0, 1, 2, \ldots, (M-1), \qquad \text{Equation (3)}$$

where $H_{mn}$ represents an entry of an mth row and an nth column in the parity-check matrix H, and N(m) represents a set $N(m)=\{n:H_{mn}\neq 0\}$ indicating a position of a column corresponding to a non-zero entry in the mth row in the parity-check matrix H. In addition, in Equation 3, $H_{mn}$ and a codeword symbol $c_n$ are entries of the finite field GF(Q), and an add operation and a multiply operation are operations defined on the finite field GF(Q).

While a codeword of a non-binary parity-check code defined in Equation 3 is a non-binary symbol, information is processed bit-by-bit in real communication and broadcasting systems, such that typically, to apply modulation to the non-binary parity-check code, the non-binary symbol is converted bit-by-bit for mapping to a signal constellation and then modulation is applied. In this case, the non-binary symbol defined on the finite field GF(Q) may be converted into $\lceil \log_2 q \rceil$ bits and various conversion methods may exist. For example, for the non-binary parity-check code defined in Equation 3, a length of a codeword is N, and when a codeword symbol is defined on the finite field GF(Q), the codeword of the non-binary code may be configured using $N \cdot \lceil \log_2 q \rceil$ bits.

FIG. 1 is a schematic block diagram of a transmitter and a receiver according to an embodiment of the present disclosure.

Referring to FIG. 1, a transmitter 100 may include a channel coder 101, an interleaver 102, and a signal constellation mapper 103. When a non-binary channel coding scheme is used in the channel coder 101, plural bit data pieces to which channel coding is to be applied are properly converted into a non-binary symbol to generate a non-binary codeword, and if necessary, an order is re-arranged through the interleaver 102, and proper modulation is performed from a corresponding bit sequence through the signal constellation mapper 103. The interleaver 102 may be used in various forms or may be removed, if necessary. It should be noted that conversion into a modulation signal after determination of signal constellation through the signal constellation mapper 103 is omitted from FIG. 1 for convenience.

A receiver 110 may include a binary demapper 111, a deinterleaver 112, a non-binary converter 113, and a channel decoder 114. The binary demapper 111 calculates a bitwise Likelihood Ratio (LR) or a value corresponding thereto for a signal received from a channel. The deinterleaver 112 properly re-arranges the calculated value. The non-binary converter 113 calculates LR values or values corresponding thereto from a plurality of interleaved calculated values. The output value of the non-binary converter 113 is applied to the channel decoder 114 to obtain a non-binary codeword or bit values corresponding thereto. The deinterleaver 112 may be implemented in various forms or may be removed, if necessary. It should be noted that demodulation for receiving a signal from the channel before the binary demapper 111 to convert the signal into values suitable for application to the binary demapper 111 is omitted from FIG. 1 for convenience.

As described with reference to FIG. 1, a general non-binary coding system is configured to properly map a codeword generated from one channel coder to a signal constellation. For example, a non-binary codeword generated on the finite field GF(Q) may be mapped to an M-QAM signal constellation having an order of M that satisfies M=Q or to two M-QAM signal constellations in which M satisfies Q=M*M.

However, typically, non-binary coding is not easy to apply an actual system because decoding complexity increases as the Q value increases. Moreover, in modulation using an M-ary signal constellation such as M-QAM, the number of bits that may be carried with one-time channel use is M, such that a spectral efficiency may increase as the M value increases. Consequently, in the modulation using the M-ary signal constellation, a small M value leads to a low spectral efficiency, and thus, a proper M value needs to be used in an actual system. For example, in system implementation, it is important to set a proper Q value taking the complexity of a non-binary code into account and a proper M value taking a spectral efficiency into account.

Therefore, various embodiments of the present disclosure propose a signal constellation mapping method that considers proper complexity and spectral efficiency based on codewords generated from a plurality of non-binary coders.

Figure 2:
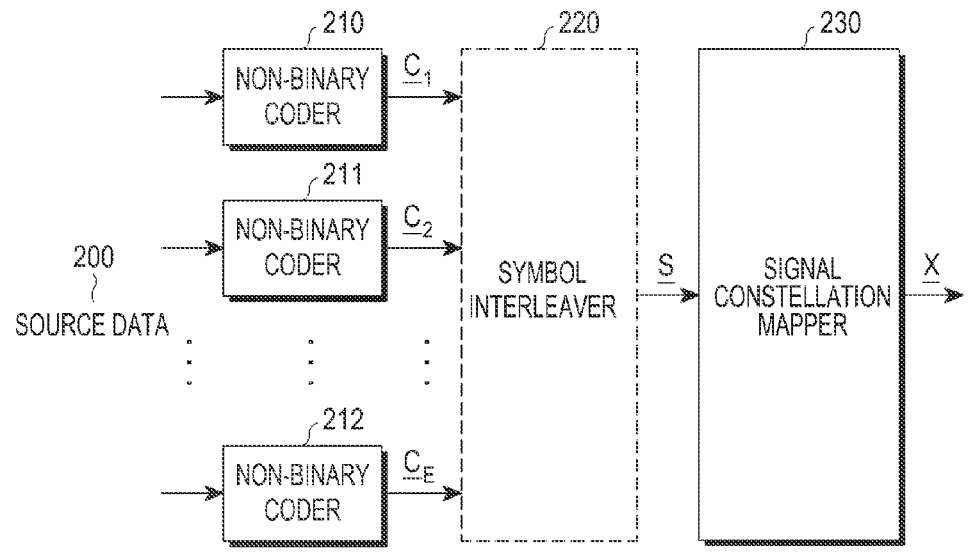
FIG. 2 is a block diagram of a transmitter according to an embodiment of the present disclosure.

FIG. 2 is a block diagram of a transmitter according to an embodiment of the present disclosure.

Referring to FIG. 2, given source data 200 is properly divided to a plurality of data streams which are then applied to a plurality of non-binary coders 210 through 212, respectively, for coding. Some of the non-binary coders 210 through 212 may include binary coders. Results of coding performed in the plurality of non-binary coders 210 through 212 are interleaved through a symbol interleaver 220 and are properly mapped to a signal constellation through a signal constellation mapper 230. Herein, it should be noted that the symbol interleaver 220, unlike the interleaver 102 of FIG. 1, performs interleaving symbol-by-symbol. Herein, a symbol means a codeword symbol generated by each of the plurality of non-binary coders 210 through 212, and the symbols are not necessarily defined on the same finite field. The entire codeword symbol may be interleaved as in FIG. 2, but interleaving may also be performed section-by-section by dividing the codeword symbol into a plurality of sections, such that interleaving may be applied or may not be applied to a section.

Let finite fields on which codeword symbols generated by the plurality of non-binary coders 210 through 212 in FIG. 2 are generated be $GF(Q\_1), GF(Q\_2), \ldots,$ and $GF(Q\_E)$, and a length of each codeword including bon-binary symbols be N. Then, the total numbers of bits of codewords generated from the respective non-binary coders 210 through 212 may be different from each other, like $N*Q\_1, N*Q\_2, \ldots,$ and $N*Q\_E$.

Referring to FIG. 2, signal constellation mapping is performed by properly combining a plurality of non-binary symbols. The signal constellation mapping may be performed according to various rules. For example, when non-binary codeword symbols defined on $GF(Q\_1), GF(Q\_2), \ldots,$ and $GF(Q\_E)$, which are outputs of the plurality of non-binary coders 210 through 212, are applied to M-QAM having an order of $M=Q\_1*Q\_2* \ldots *Q\_E$, 1:1 correspondence is established and thus natural signal constellation mapping is achieved.

Figure 3:
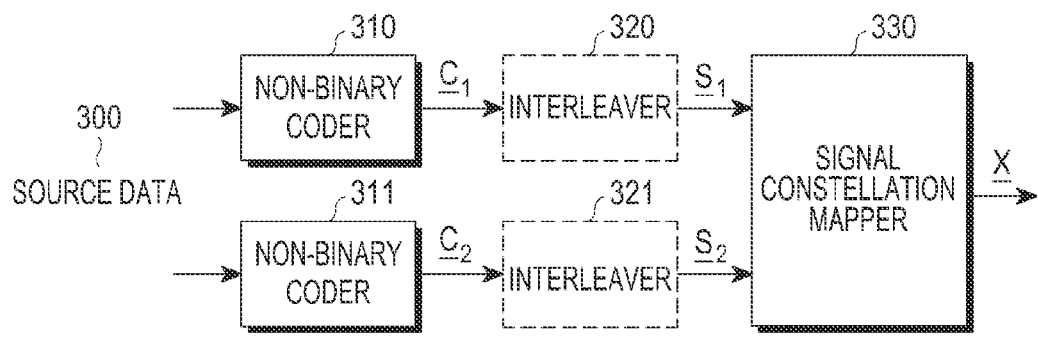
FIG. 3 is a block diagram of a transmitter according to an embodiment of the present disclosure.
Figure 4A:
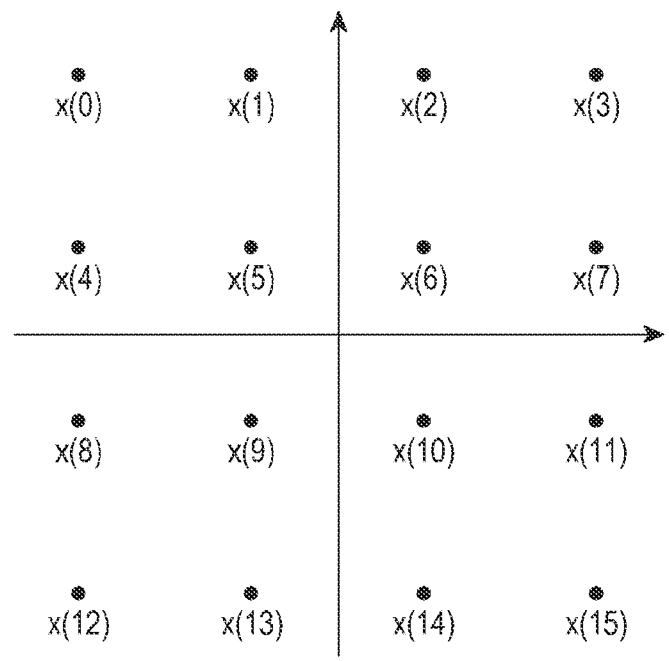
FIGS. 4A and 4B illustrate an example of a signal constellation corresponding to a 16-Quadrature Amplitude Modulation (QAM) modulation scheme according to an embodiment of the present disclosure.
Figure 4B:
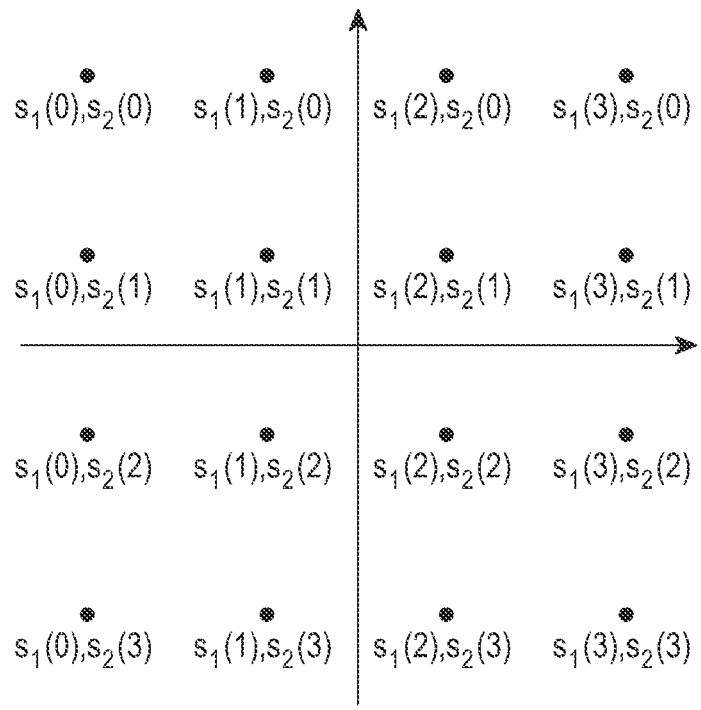

FIG. 3 is a block diagram of a transmitter according to an embodiment of the present disclosure. FIGS. 4A and 4B illustrate an example of a signal constellation corresponding to a 16-Quadrature Amplitude Modulation (QAM) modulation scheme according to an embodiment of the present disclosure.

Referring to FIG. 3, given source data 300 is properly distributed to two non-binary coders 310 and 311. The non-binary coders 310 and 311 are assumed to generate non-binary codewords defined on GF(4), respectively, and the codeword symbols are expressed with 0, 1, 2, and 3, for convenience. The codeword symbols obtained from the non-binary coders 310 and 311 are applied to interleavers 320 and 321, if necessary. In FIG. 3, the interleavers 320 and 321 are provided for respective coders, but according to a system, the interleavers 320 and 321 may be integrated into one interleaver or may not be provided. If necessary, the interleavers 320 and 321 perform interleaving on a binary code in the unit of a bit and perform interleaving on a non-binary code in the unit of a non-binary symbol, if necessary. Let non-binary symbols input to the signal constellation mapper 330 after passing through the interleavers 320 and 321 be $s_1$ and $s_2$ (for reference, in FIG. 3, $\underline{S_1}$, and $\underline{S_2}$ indicate symbol sequences of $\{s_{1,0}, s_{1,1}, s_{1,2}, \ldots\}$ and $\{s_{2,0}, s_{2,1}, s_{2,2}, \ldots\}$, respectively).

The symbols $s_1$ and $s_2$ include entries of GF(4), respectively, such that a signal constellation mapped from the pair $(s_1, s_2)$ may use 16(=4*4)-ary modulation. For example, an example of mapping to a 16-QAM signal constellation according to $(s_1, s_2)$ values is expressed in Equation 4, Table 1, and is illustrated in FIGS. 4A and 4B.

$$S \rightarrow X:(s_1(i_1),s_2(i_2)) \rightarrow x(j) \qquad \text{Equation (4)}$$

TABLE 1

| $i_1$ | 0 | 1 | 2 | 3 | 0 | 1 | 2 | 3 | 0 | 1 | 2 | 3 | 0 | 1 | 2 | 3 |
|---|---|---|---|---|---|---|---|---|---|---|---|---|---|---|---|---|
| $i_2$ | 0 | 0 | 0 | 0 | 1 | 1 | 1 | 1 | 2 | 2 | 2 | 2 | 3 | 3 | 3 | 3 |
| $j$ | 0 | 1 | 2 | 3 | 4 | 5 | 6 | 7 | 8 | 9 | 10 | 11 | 12 | 13 | 14 | 15 |

Referring to Equation 4, Table 1, and FIGS. 4A and 4B, it can be seen that as $(s_1, s_2)$ values are changed, mapping to a 16-QAM signal constellation is established. For example, when $(i_1, i_2)$ are $(3, 1)$, $j=7$, such that the values correspond to a signal constellation $x(7)$ of FIG. 4A and $(s_1(3), s_2(1))$ of FIG. 4B.

Referring to FIG. 3, Equation 4, Table 1, and FIGS. 4A and 4B, a description has been made of the embodiment of the system in which symbols defined on GF(4) and output from two non-binary coders are mapped to one signal constellation. In such a scheme, the order of the finite field is as low as Q=4, but the order of modulation increases like M=4*4=16. For example, a low decoding complexity may be implemented due to a low order of the finite field, whereas a high spectral efficiency may be obtained due to a high order of modulation.

Figure 5:
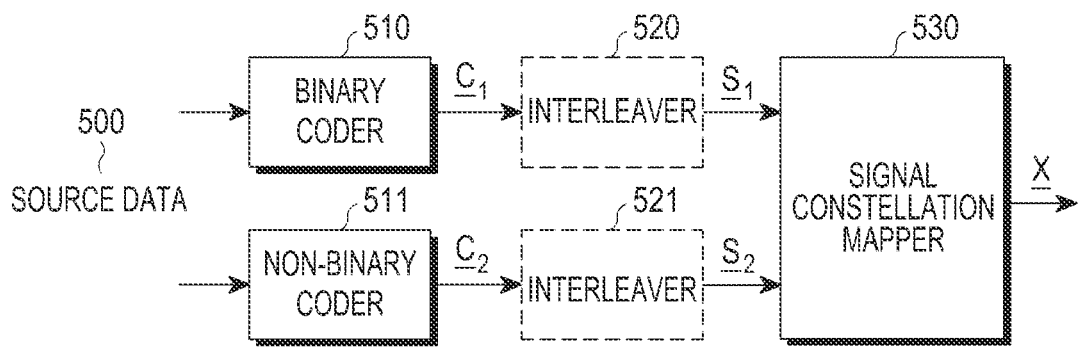
FIG. 5 is a block diagram of a transmitter according to an embodiment of the present disclosure.
Figure 6A:
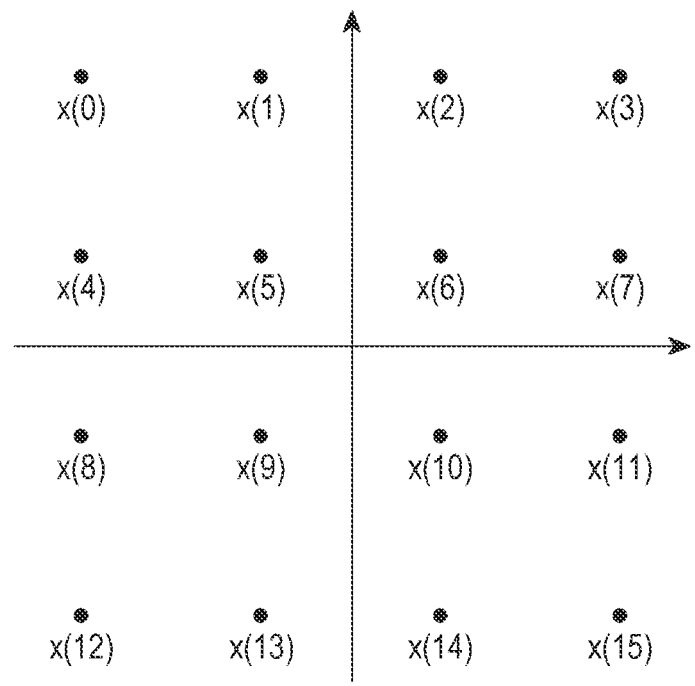
FIGS. 6A and 6B illustrate an example of a signal constellation corresponding to a 16-QAM modulation scheme according to an embodiment of the present disclosure.
Figure 6B:
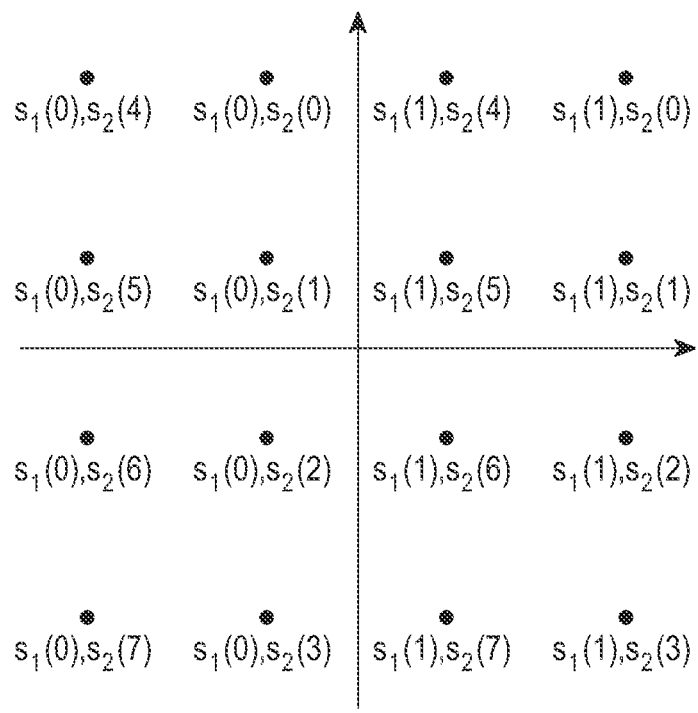

FIG. 5 is a block diagram of a transmitter according to an embodiment of the present disclosure. FIGS. 6A and 6B illustrate an example of a signal constellation corresponding to a 16-QAM modulation scheme according to an embodiment of the present disclosure.

Referring to FIG. 5, given source data 500 is properly distributed to two coders 510 and 511. The coder 510 is a binary coder and the coder 511 is a non-binary coder. The coders 510 and 511 are assumed to generate codeword symbols defined in GF(2) and GF(8), respectively, and the code word symbols are expressed as 0 and 1, and 0, 1, 2, 3, 4, 5, 6, and 7, respectively, for convenience. The codeword symbols obtained from the coders 510 and 511 are applied to interleavers 520 and 521, if necessary. Although the interleavers 520 and 521 are provided separately for the coders 510 and 511 in FIG. 5, the interleavers 520 and 521 may be integrated into one interleaver or may not be provided according to a system. The interleavers 520 and 521 perform interleaving on a binary code in the unit of a bit and perform interleaving on a non-binary code in the unit of a non-binary symbol, if necessary. Let non-binary symbols input to a signal constellation mapper 530 after passing through the interleavers 520 and 521 be $s_1$ and $s_2$ (for reference, in FIG. 5, $\underline{S_1}$, and $\underline{S_2}$ indicate symbol sequences of $\{s_{1,0}, s_{1,1}, s_{1,2}, \ldots\}$ and $\{s_{2,0}, s_{2,1}, s_{2,2}, \ldots\}$, respectively). The symbols $s_1$ and $s_2$ include entries of GF(2) and GF(8), respectively, such that a signal constellation mapped from the pair $(s_1, s_2)$ may use 16(=2*8)-ary modulation. For example, an example of mapping to a 16-QAM signal constellation according to $(s_1, s_2)$ values is expressed in Equation 5, Table 2, and is illustrated in FIGS. 6A and 6B.

Signal Constellation Mapping Rule $$S \rightarrow X:(s_1(i_1),s_2(i_2)) \rightarrow x(j) \qquad \text{Equation (5)}$$

TABLE 2

| $i_1$ | 0 | 0 | 1 | 1 | 0 | 0 | 1 | 1 | 0 | 0 | 1 | 1 | 0 | 0 | 1 | 1 |
|---|---|---|---|---|---|---|---|---|---|---|---|---|---|---|---|---|
| $i_2$ | 4 | 0 | 4 | 0 | 5 | 1 | 5 | 1 | 6 | 2 | 6 | 2 | 7 | 3 | 7 | 3 |
| j | 0 | 1 | 2 | 3 | 4 | 5 | 6 | 7 | 8 | 9 | 10 | 11 | 12 | 13 | 14 | 15 |

Referring to Equation 5, Table 2, and FIGS. 6A and 6B, it can be seen that as ($s_1$, $s_2$) values are changed, mapping to a 16-QAM signal constellation is established. For example, when ($i_1$, $i_2$) are (1, 5), j=6, such that the values correspond to a signal constellation x(6) of FIG. 6A and ($s_1(1)$, $s_2(5)$) of FIG. 6B.

Referring to FIG. 5, Equation 5, Table 2, and FIGS. 6A and 6B, a description has been made of the embodiment of the system in which symbols defined on GF(2) and GF(8) and output from two coders are mapped to one signal constellation. In such a scheme, the orders of the finite fields are as low as $Q_1$=2 and $Q_2$=8, but the order of modulation increases like M=$Q_1$*$Q_2$=2*8=16. For example, a low decoding complexity may be implemented due to a low order of the finite field, whereas a high spectral efficiency may be obtained due to a high order of modulation.

Figure 7A:
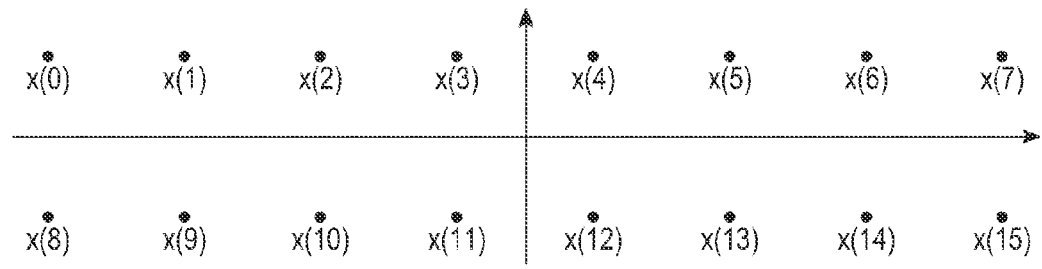
FIGS. 7A and 7B illustrate a signal constellation mapping according to an embodiment of the present disclosure.
Figure 7B:
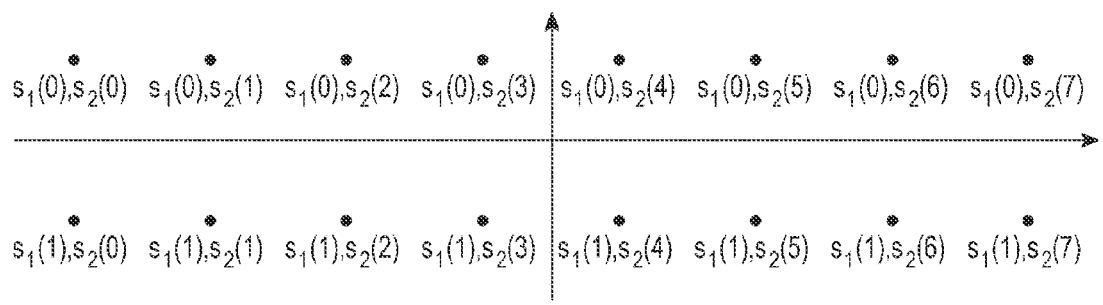

FIGS. 7A and 7B illustrate a signal constellation mapping according to an embodiment of the present disclosure. For example, FIGS. 7A and 7B illustrate an example of a signal constellation mapping such as, for example, the constellation mapping of Equation 6 and FIG. 5.

Typically, 16-QAM mainly uses a square signal constellation as illustrated in FIGS. 4A and 6A, but in some cases, a rectangular signal constellation may also be used as illustrated in FIG. 7A. In this case, signal constellation mapping as provided in Equation 6, Table 3, and FIG. 7B is proper.

Signal Constellation Mapping Rule $$S \rightarrow X:(s_1(i_1),s_2(i_2)) \rightarrow x(j) \quad \quad \text{Equation (6)}$$

TABLE 3

| $i_1$ | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|
| $i_2$ | 0 | 1 | 2 | 3 | 4 | 5 | 6 | 7 | 0 | 1 | 2 | 3 | 4 | 5 | 6 | 7 |
| j | 0 | 1 | 2 | 3 | 4 | 5 | 6 | 7 | 8 | 9 | 10 | 11 | 12 | 13 | 14 | 15 |

Referring to Equation 6, Table 3, and FIGS. 7A and 7B, it can be seen that as ($s_1$, $s_2$) values are changed, mapping to a 16-QAM signal constellation is established. For example, when ($i_1$, $i_2$) are (1, 5), j=13, such that the values correspond to a signal constellation x(13) of FIG. 7A and ($s_1(1)$, $s_2(5)$) of FIG. 7B.

As described with reference to FIGS. 2 to 7B, when proper signal constellation mapping from a plurality of binary or non-binary codewords is applied, orders of finite fields that define non-binary codewords are not high, but the modulation order may be set high, thus improving a spectral efficiency without increasing a decoding complexity. For example, mapping of symbols generated by a plurality of binary or non-binary coders to a signal constellation is selecting two or more symbols from among the symbols and mapping the selected symbols to one signal constellation, and a product of orders of finite fields on which the codeword symbols are defined is equal to an order of the signal constellation.

Although signal constellation mapping for 16-QAM modulation has been described in relation to the various embodiments of the present disclosure illustrated in FIGS. 2 to 7B, the present disclosure may also be extended to other modulation schemes. For example, signal constellation mapping for 256-QAM modulation may apply proper signal constellation mapping rules by combining symbols defined on GF(4) and GF(64), symbols defined on GF(8) and GF(32), or symbols defined on GF(16) and GF(16) as well as symbols defined on GF(2) and GF(128). Moreover, three or more codes may be combined, and for example, codes defined on GF(2), GF(2), and GF(64) may be combined, codes defined on GF(2), GF(8), and GF(16) may be combined, or codes defined on GF(4), GF(4), and GF(16) may be combined.

As such, for various modulation schemes, proper signal constellation mapping may be obtained by combining two or more binary or non-binary codes.

Next, the present disclosure proposes a method and apparatus for efficiently decoding a signal at a receiver in signal transmission by applying signal constellation mapping from codewords generated from a plurality of non-binary coders, based on proper complexity and spectral efficiency.

Figure 8:
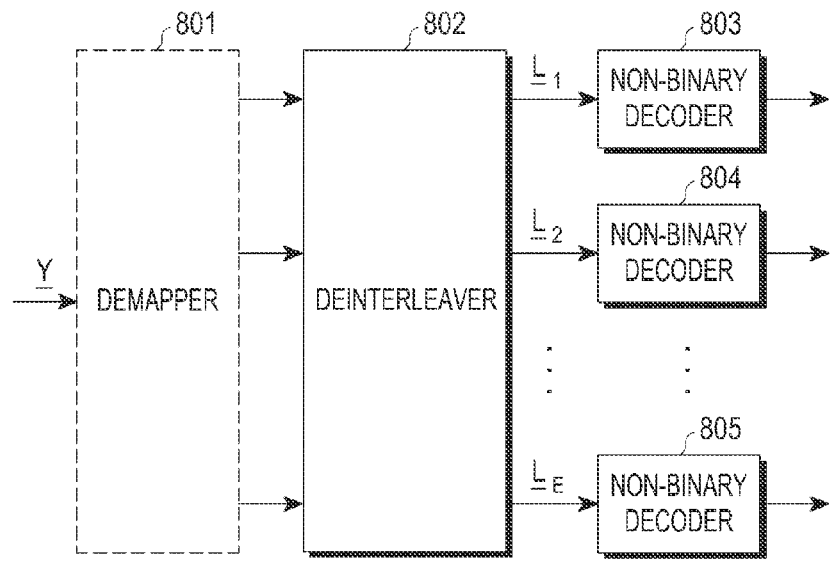
FIG. 8 is a block diagram of a receiver according to an embodiment of the present disclosure.

FIG. 8 is a block diagram of a receiver according to an embodiment of the present disclosure.

Referring to FIG. 8, a receiver according to various embodiments of the present disclosure may include a demapper 801, a deinterleaver 802, and a plurality of non-binary decoders 803, 804, and 805. Data Y received from a channel is mapped to the non-binary demapper 801. The non-binary demapper 801 calculates a finite-field-symbol-wise LR or a value corresponding thereto from a signal received from the channel for use as an input to a channel decoder. The calculated value is properly re-arranged by the deinterleaver 802, such that a plurality of deinterleaved values are properly input to the plurality of non-binary decoders 803, 804, and 805, finally obtaining a non-binary codeword or bit values corresponding thereto. The deinterleaver 802 may perform deinterleaving with respect to the entire codeword symbol like in FIG. 8, or may perform deinterleaving section-by-section by dividing the codeword symbol into a plurality of sections, such that interleaving may be applied or may not be applied to a section.

FIGS. 9A, 9B, 10A, and 10B are diagrams for describing a detailed operation of the non-binary demapper such as, for example, the non-binary demapper illustrated in FIG. 8 according to an embodiment of the present disclosure.

Figure 9A:
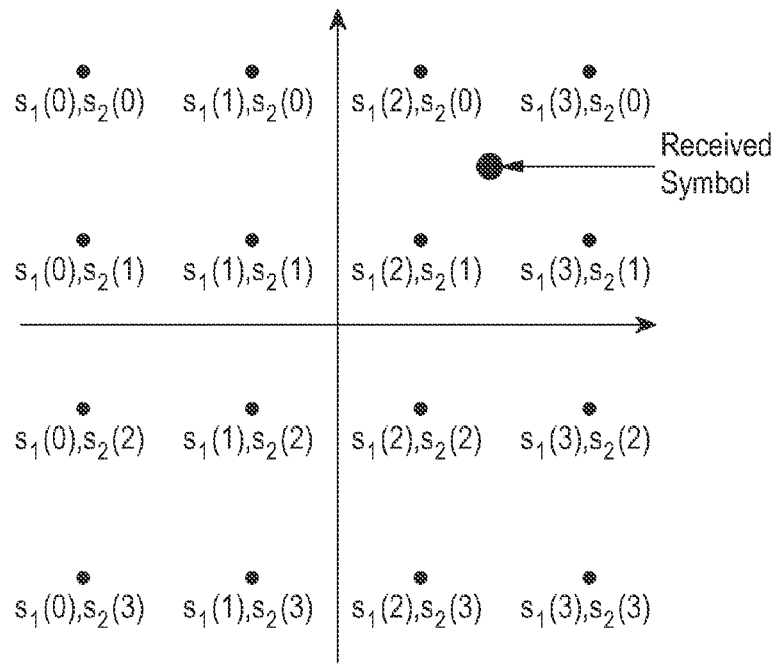
FIGS. 9A, 9B, 10A, and 10B are diagram for describing a detailed operation of a non-binary demapper such as, for example, the non-binary demapper illustrated in FIG. 8 according to an embodiment of the present disclosure.
Figure 9B:
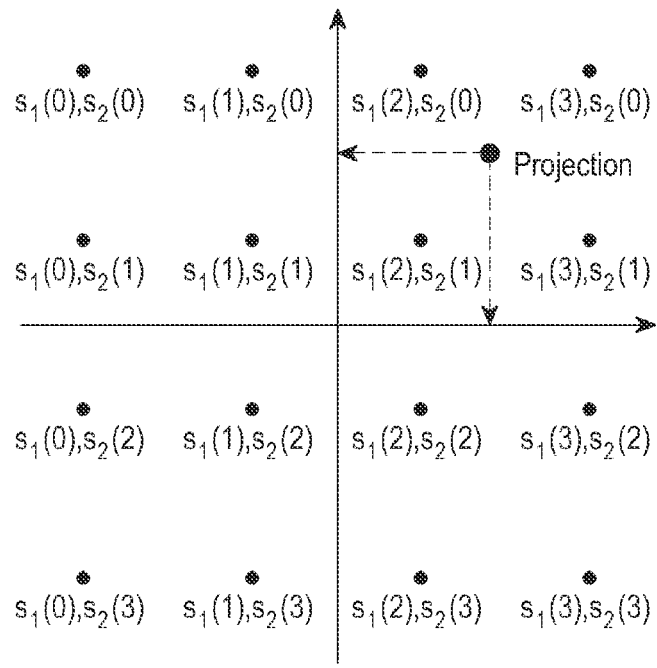
Figure 10A:
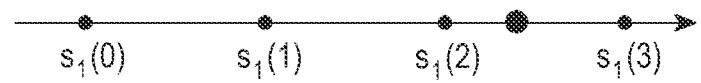
Figure 10B:

Assuming that a received signal (or received symbol) is situated on a signal constellation as indicated "Received Symbol" in FIG. 9A and signal constellation mapping rules of Equation 4 and Table 1 is used, mapping to an X-axis (real-number axis) coordinate and mapping to a Y-axis (imaginary-number axis) coordinate are independent of each other in the mapping rules of Equation 4 and Table 1, such that demapping (or demodulation) may be performed by regarding the received signal as being projected to each axis as illustrated in FIG. 9B. Considering such projection, the received signal illustrated in FIG. 9A is regarded as two received signals corresponding to the real axis and the imaginary axis as illustrated in FIGS. 10A and 10B, such that a finite-field-symbol-wise LR or a value corresponding thereto may be calculated.

For example, if a position of a signal y received assuming an Additive White Gaussian Noise (AWGN) channel is indicated by $y=(y_R, y_I)$ according to each axis in FIG. 9A, then signal-constellation-specific reception probabilities $Pr(y_R|E_{R,i})$ and $Pr(y_I|E_{I,i})$ may be expressed as follows:

$$Pr(y_R | E_{R,i}) = \frac{1}{\sqrt{2\pi\pi_R^2}} \exp\left(-\frac{(y_R - E_{R,i})^2}{2\sigma_R^2}\right), \quad \text{Equation (7)}$$

$$Pr(y_I | E_{I,i}) = \frac{1}{\sqrt{2\pi\sigma_I^2}} \exp\left(-\frac{(y_I - E_{I,i})^2}{2\sigma_I^2}\right),$$

where $i=\{0, 1, 2, 3\}$, $E_{R,i}$ indicates a real-axis coordinate of $s_1(i)$, $E_{I,i}$ indicates an imaginary-axis coordinate of $s_2(i)$, and $\sigma_R^2$ and $\sigma_I^2$ indicate variance values of noise components of the real axis and the imaginary axis. Such a signal-constellation-specific reception probability may be input to the non-binary decoders 803, 804, and 805 for use in decoding, or may be changed into LR values as expressed in Equation 8 and input to the non-binary decoders 803, 804, and 805 for use in decoding.

$$L_{R,1} = \frac{Pr(y_R | E_{R,1})}{Pr(y_R | E_{R,0})}, L_{R,2} = \frac{Pr(y_R | E_{R,2})}{Pr(y_R | E_{R,0})}, \quad \text{Equation (8)}$$

$$L_{R,3} = \frac{Pr(y_R | E_{R,3})}{Pr(y_R | E_{R,0})}$$

$$L_{I,1} = \frac{Pr(y_I | E_{I,1})}{Pr(y_I | E_{I,0})}, L_{I,2} = \frac{Pr(y_I | E_{I,2})}{Pr(y_I | E_{I,0})},$$

$$L_{I,3} = \frac{Pr(y_{IR} | E_{I,3})}{Pr(y_I | E_{I,0})}$$

If mapping to the X-axis (real axis) coordinate and mapping to the Y-axis (imaginary axis) coordinate are independent of each other as provided in the rules of Equation 4 and Table 1, demapping may be performed for each axis, thus reducing the complexity of calculating an LR value or values corresponding thereto during demodulation. For example, for $M=Q*Q$, an LR value or values corresponding thereto may be calculated for Q non-binary symbols with respect to each axis, thus reducing a complexity to a square root order.

As such, according to an embodiment of the present disclosure, when modulation is performed by mapping two non-binary codes defined on finite fields having orders of $Q_1$ and $Q_2$ to an M-ary signal constellation for $M=Q_1*Q_2$, if mapping rules of the M-ary signal constellation indicate that mapping to a real-axis coordinate and mapping to an imaginary-axis coordinate are performed independently of each other, then an LR value or a value corresponding thereto is independently calculated assuming that a received signal is projected to each axis in demodulation.

When the signal constellation mapping rules of Equation 6 and Table 3 are applied to the QAM signal constellation as illustrated in FIGS. 7A and 7B, mapping to the real axis and mapping to the imaginary axis are independent of each other, such that the received signal is regarded as being projected to each axis as illustrated in FIG. 9B and an LR value or a value corresponding thereto is calculated similarly with Equation 7 and Equation 8 to perform decoding. In this case, two non-binary codes defined on finite fields having orders of $Q_1(=2)$ and $Q_2(=8)$ are used, such that one of them may be decoded in the same manner as a binary code and the other code may be decoded on GF(8). In addition, the binary code may be regarded as using Binary Phase Shift Keying (BPSK) modulation, and the non-binary code defined on GF(8) may be regarded as using 8-Pulse Amplitude Modulation (PAM). These modulation schemes do not provide reliability of the same level, thus providing different decoding capabilities. Consequently, by performing modulation based on a combination of different non-binary coding schemes, different qualities of services may be provided.

In modulation that applies the signal constellation mapping rules of Equation 5 and Table 2 to QAM of FIGS. 6A and 6B, mapping to a real-axis coordinate and mapping to an imaginary-axis coordinate are not independent of each other. For example, in spite of $i_1=0$, two types of X coordinates may be provided for a value of $i_2$. In this case, therefore, demodulation cannot be performed by simply regarding the received signal as being projected to each axis. When non-binary codes defined different finite fields for different $Q_1$ and $Q_2$ are used, different types of demapping (or demodulation) need to be performed.

FIGS. 11A, 11B, 12, and 13 are diagrams for describing an operation of a non-binary demapper such as, for example, the non-binary demapper illustrated in FIG. 8 according to an embodiment of the present disclosure.

Figure 11A:
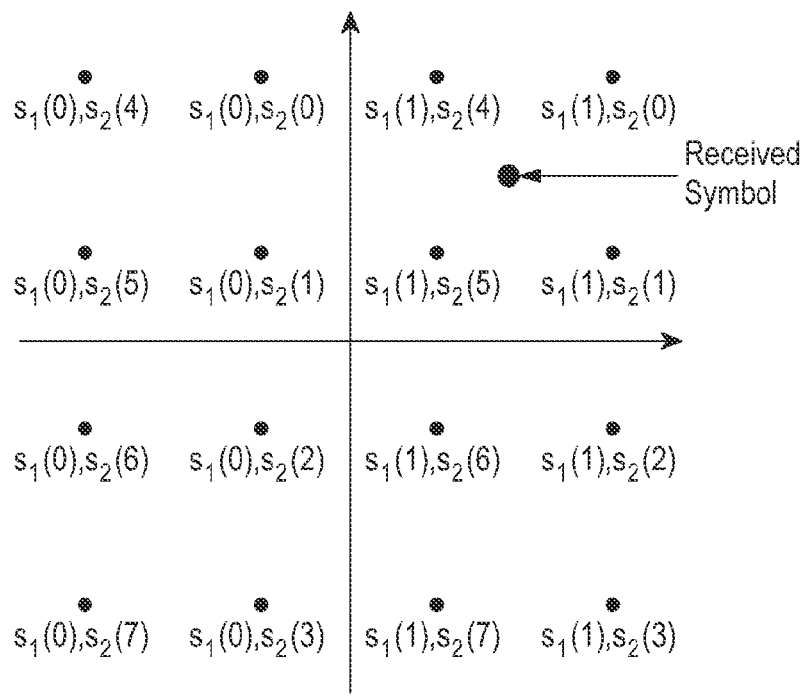
FIGS. 11A, 11B, 12, and 13 are diagrams for describing an operation of a non-binary demapper such as, for example, the non-binary demapper illustrated in FIG. 8 according to an embodiment of the present disclosure.
Figure 11B:
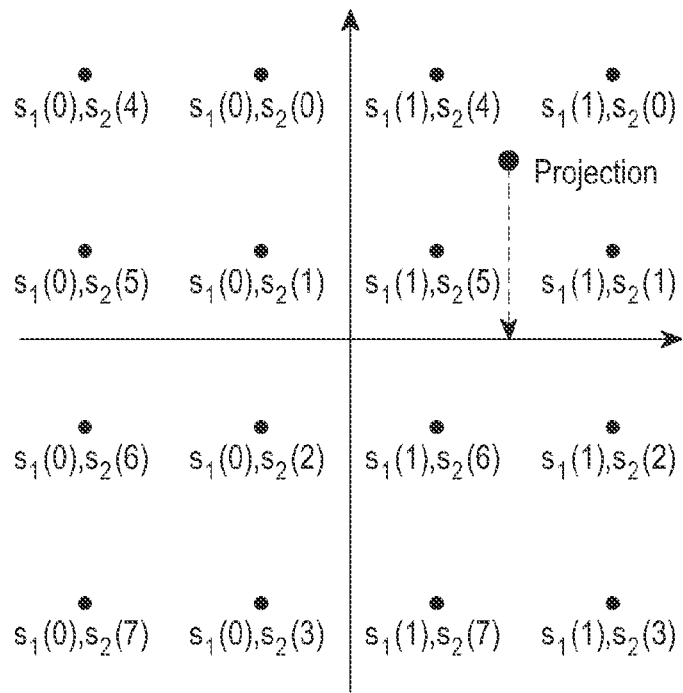
Figure 12:

For example, assuming that a received signal is situated on a signal constellation as indicated "Received Symbol" in FIG. 11A, projection is performed around an axis on which a coordinate is determined merely by a symbol of a finite field corresponding to the smaller one between $Q_1$ and $Q_2$. For example, in the embodiment illustrated in FIG. 11A, $Q_1=2$ and $Q_2=8$ and an X-axis coordinate is determined for $Q_1=2$ and an X-axis coordinate and a Y-axis coordinate are determined for $Q_2$, such that the received signal is regarded as being projected to the X axis as illustrated in FIG. 11B. Then, the received signal may be regarded as corresponding to the real axis as illustrated in FIG. 12. Considering such projection, for a probability of a symbol related to the X axis in the received signal illustrated in FIG. 11A, a finite-field-symbol-wise LR value or value corresponding thereto may be calculated by regarding the received signal as corresponding to the X axis as illustrated in FIG. 12.

For example, if a position of a signal y received assuming an AWGN channel is indicated by $y=(y_R, y_I)$ according to each axis in FIG. 11A, then a signal-constellation-specific reception probability $Pr(y_R|E_{R,i})$ may be expressed as follows:

$$Pr(y_R | E_{R,i}) = \frac{1}{\sqrt{2\pi\sigma_R^2}} \exp\left(-\frac{(y_R - E_{R,i})^2}{2\sigma_R^2}\right) \quad \text{Equation (9)}$$

$(i = 0, 1, 2, 3),$ where $E_{R,i}$ indicates a real-axis coordinate of s1(i) and $\sigma_R^2$ indicates a variance of each real-axis noise component. The signal-constellation-specific reception probability may be input to the non-binary decoders 803, 804, and 805 for use in decoding or may be changed into LR values and then input to the non-binary decoders 803, 804, and 805 for use in decoding. In FIG. 12, however, s1(0) and s1(1) correspond to a non-binary symbol 0 and a non-binary symbol 1 or the non-binary symbol 1 and the non-binary symbol 0, respectively, and thus when they are changed into LR values for input to the non-binary decoders 803, 804, and 805 and for use in decoding, they may be calculated for use, as follows:

$$L_R = \frac{Pr(y_R|E_{R,2}) + Pr(y_R|E_{R,3})}{Pr(y_R|E_{R,0}) + Pr(y_R|E_{R,1})} \text{ or}$$

$$L_R = \frac{Pr(y_R|E_{R,0}) + Pr(y_R|E_{R,1})}{Pr(y_R|E_{R,2}) + Pr(y_R|E_{R,3})}$$

Equation (10)

Figure 13:
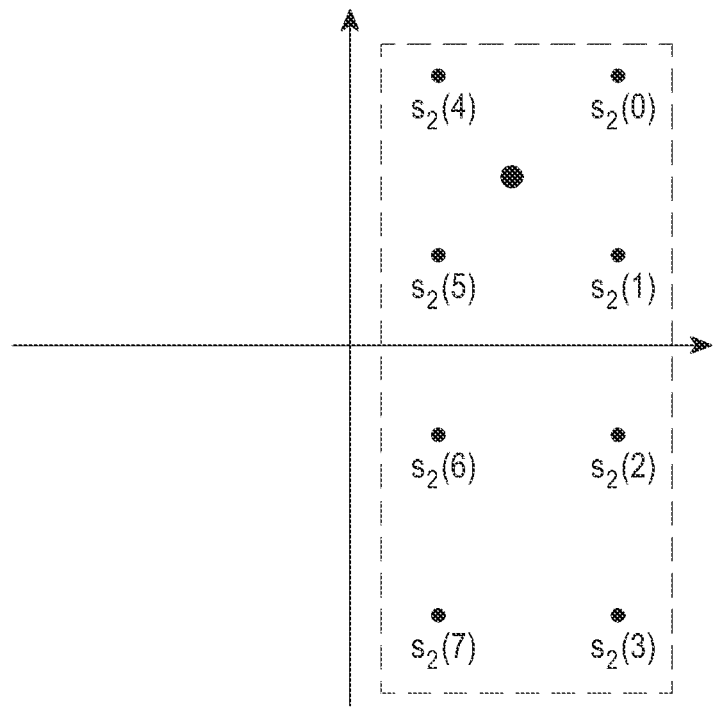

In contrast, mapping of a non-binary symbol defined on a finite field $GF(Q_2)$ for $Q_2=8$ affects both the X-axis coordinate and the Y-axis coordinate, and thus simple projection as illustrated in FIG. 12 cannot be used. Consequently, the given signal constellation illustrated in FIG. 11A is divided into $M/Q_2=Q_1$ regions from which regions between one and $Q_1$ are selected for demapping. FIG. 13 illustrates an example in which the signal constellation is divided into left and right ($Q_1=2$) regions and the right region is selected. A criterion for dividing the signal constellation or a criterion for selecting a region may be determined variously, and typically, a region including a received signal is selected.

Upon completion of region selection, the received signal is regarded as a received signal for an 8-QAM signal constellation of the selected region and a finite-field-symbol-wise LR value or a value corresponding thereto may be calculated.

For example, a signal-constellation-specific reception probability $Pr(y|E_i)$ of a signal y received assuming the AWGN channel may be expressed as follows:

$$Pr(y|E_i) = \frac{1}{\sqrt{2\pi\sigma^2}} \exp\left(-\frac{|y - E_i|^2}{2\sigma^2}\right)$$

Equation (11)

$(i = 0, 1, 2, \ldots, 7)$, where $E_i$ indicates an imaginary-axis coordinate of $s_2(i)$ in a selected region, and $\sigma^2$ indicates a variance of each noise component. The signal-constellation-specific reception probability may be input to the non-binary decoders 803, 804, and 805 for use in decoding, or may be changed into an LR value and input to the non-binary decoders 803, 804, and 805 for use in decoding.

Characteristics of Equation 11 are calculating the probability on a complex plane, unlike in the previous embodiment. For example, determination of an X-axis coordinate and determination of a Y-axis coordinate for $s_2(i)$ are not independent of each other, such that the probability needs to be calculated on the complex plane as in Equation 11. When being changed into an LR value, the probability is expressed without separation for the real axis and the imaginary axis, as follows:

$$L_i = \frac{Pr(y|E_i)}{Pr(y|E_0)} \quad (i = 1, 2, \ldots, 7)$$

Equation (12)

Referring to FIG. 13, a description has been made of the embodiment of the present disclosure in which demapping is performed based on selection of one region, but generally, demapping may be performed based on selection of one or more regions. By doing so, accurate demapping may be possible, thus improving performance, but complexity may increase due to an increase in the size of a signal constellation for demapping. For example, complexity and performance have a trade-off relationship.

As such, according to various embodiments of the present disclosure, when modulation is performed by mapping two non-binary codes defined on finite fields having orders of $Q_1$ and $Q_2$ ($Q_1<Q_2$) to an M-ary signal constellation for $M=Q_1*Q_2$, if mapping rules of the M-ary signal constellation indicate that mapping to a real-axis coordinate and mapping to an imaginary-axis coordinate are not performed independently of each other, demapping is performed by regarding that a received signal is projected to an axis on which a coordinate is determined merely by a symbol of a finite field corresponding to $Q_1$. And then, one or more regions are determined based on the received signal from among $Q_1$ regions obtained by dividing the M-ary signal constellation in advance, and a probability or LR values of a received signal for each signal constellation coordinate may be calculated to complete demapping.

Other effects that may be obtained or estimated from the various embodiments of the present disclosure are explicitly or implicitly disclosed in the detailed description of the various embodiments of the present disclosure. For example, various effects expected according to the various embodiments of the present disclosure are disclosed in the detailed description of the present disclosure.

It will be appreciated that various embodiments of the present disclosure according to the claims and description in the specification can be realized in the form of hardware, software or a combination of hardware and software.

Any such software may be stored in a non-transitory computer readable storage medium. The non-transitory computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disk (CD), Digital Versatile Disc (DVD), magnetic disk or magnetic tape or the like. It will be appreciated that the storage devices and storage media are various embodiments of non-transitory machine-readable storage that are suitable for storing a program or programs comprising instructions that, when executed, implement various embodiments of the present disclosure. Accordingly, various embodiments provide a program comprising code for implementing apparatus or a method as claimed in any one of the claims of this specification and a non-transitory machine-readable storage storing such a program.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for transmitting a signal in broadcasting and communication systems, the method comprising:
   dividing source data into two or more streams and respectively coding the two or more streams to codeword symbols;
   selecting two or more symbols from among the codeword symbols;

modulating the selected two or more symbols by mapping the selected two or more symbols to one signal constellation for modulation to produce a modulated signal; and transmitting the modulated signal, wherein the codeword symbols comprise one or more non-binary codewords, and a product of orders of finite fields on which the codeword symbols are defined is equal to an order of the signal constellation.

2. The method of claim 1, further comprising:
interleaving the codeword symbols after the coding of the two or more streams,
wherein the interleaving of the codeword symbols is performed symbol-by-symbol.

3. A non-transitory computer-readable storage medium storing instructions that, when executed, cause at least one processor to perform the method of claim 1.

4. A method for receiving a signal in broadcasting and communication systems, the method comprising:
demodulating the received signal to calculate finite-field-symbol-wise Likelihood Ratio (LR) values or signal-constellation-specific reception probabilities; and
decoding the calculated values or probabilities to obtain codeword symbols comprising at least one non-binary codeword,
wherein a product of orders of each of finite fields on each of the codeword symbols is defined is equal to an order of the signal constellation,
wherein the codeword symbols are selected from among codeword symbols produced by coding two or more streams, and
wherein if the received signal is generated from two non-binary codeword symbols and mapping rules in which mapping to a real axis and mapping to an imaginary axis are independent of each other are applied in mapping of the non-binary codeword symbols to the signal constellation, then the calculating of the finite-field-symbol-wise LR values or signal-constellation-specific reception probabilities comprises demodulating the received signal with respect to the real axis and the imaginary axis of the signal constellation, respectively, to calculate the finite-field-symbol-wise LR values or signal-constellation-specific reception probabilities.

5. The method of claim 4, further comprising:
re-arranging the calculated values or probabilities by interleaving the calculated values for all codeword symbols or for each of a plurality of sections of the all codeword symbols, after the calculating of the finite-field-symbol-wise LR values or signal-constellation-specific reception probabilities.

6. A method for receiving a signal in broadcasting and communication systems, the method comprising:
demodulating the received signal to calculate finite-field-symbol-wise Likelihood Ratio (LR) values or signal-constellation-specific reception probabilities; and
decoding the calculated values or probabilities to obtain codeword symbols comprising at least one non-binary codeword,
wherein a product of orders of each of finite fields on which each of the codeword symbols is defined is equal to an order of the signal constellation,
wherein the codeword symbols are selected from among codeword symbols produced by coding two or more streams, and
wherein, if the received signal is generated from two non-binary codeword symbols, orders of finite fields on which the non-binary codeword symbols are defined are different from each other, and mapping rules in which mapping to the real axis and mapping to the imaginary axis are not independent of each other are applied, then the calculating of the finite-field--symbol-wise LR values or signal-constellation-specific reception probabilities comprises:
performing demodulation with respect to an axis on which a coordinate is determined by the non-binary codeword symbol corresponding to the smaller order among orders of the finite fields;
selecting one or more regions from among a plurality of regions divided in advance from the signal constellation based on the received signal; and
demodulating the received signal with respect to the real axis and the imaginary axis in the selected region to calculate the finite-field-symbol-wise LR values or signal-constellation-specific reception probabilities.

7. The method of claim 6, wherein the selecting of the one or more regions comprises:
selecting the one or more regions comprising a region where the received signal is situated.

8. The method of claim 6, wherein the selecting of the one or more regions comprises:
selecting the one or more regions comprising a region corresponding to an order that is smaller than the smaller order among the orders of the finite fields.

9. The method of claim 6, wherein the signal constellation is divided into regions of a number that is equal to a result of dividing an order of the signal constellation by the smaller order among the orders of the finite field.

10. An apparatus for transmitting a signal in broadcasting and communication systems, the apparatus comprising:
a coder configured to divide source data into two or more streams and to respectively code the two or more streams to produce codeword symbols; and
a signal constellation mapper configured to select two or more symbols from among the codeword symbols, to modulate the selected two or more symbols by mapping the two or more selected symbols to one signal constellation for modulation to produce a modulated signal, and to transmit the modulated signal,
wherein the codeword symbols comprise one or more non-binary codewords, and a product of orders of finite fields on which the codeword symbols are defined is equal to an order of the signal constellation.

11. The apparatus of claim 10, further comprising:
an interleaver configured to interleave the codeword symbols after the coding of the two or more streams,
wherein the interleaver performs the interleaving symbol-by-symbol.

12. The apparatus of claim 10, wherein the coder comprises one or more binary coders and one or more non-binary coders.

13. An apparatus for receiving a signal in broadcasting and communication systems, the apparatus comprising:
a signal constellation demapper configured to demodulate the received signal to calculate finite-field-symbol-wise Likelihood Ratio (LR) values or signal-constellation-specific reception probabilities; and
a decoder configured to decode the calculated values or probabilities to obtain codeword symbols comprising at least one non-binary codeword,
wherein a product of orders of each of finite fields on which each of the codeword symbols is defined is equal to an order of the signal constellation,
wherein the codeword symbols are selected from among codeword symbols produced by coding two or more streams, and wherein if the received signal is generated from two nonbinary codeword symbols and mapping rules in which mapping to a real axis and mapping to an imaginary axis are independent of each other are applied in mapping of the non-binary codeword symbols to the signal constellation, then the signal constellation demapper demodulates the received signal with respect to the real axis and the imaginary axis of the signal constellation, respectively, to calculate the finite-field-symbol-wise LR values or signal-constellation-specific reception probabilities.

14. The apparatus of claim 13, further comprising:
a deinterleaver configured to re-arrange the calculated values or probabilities by interleaving the calculated values for all codeword symbols or for each of a plurality of sections of the all codeword symbols.

15. An apparatus for receiving a signal in broadcasting and communication systems, the apparatus comprising:
a signal constellation demapper configured to demodulate the received signal to calculate finite-field-symbol-wise Likelihood Ratio (LR) values or signal-constellation-specific reception probabilities; and
a decoder configured to decode the calculated values or probabilities to obtain codeword symbols comprising at least one non-binary codeword,
wherein a product of orders of each of finite fields on which each of the codeword symbols is defined is equal to an order of the signal constellation,
wherein the codeword symbols are selected from among codeword symbols produced by coding two or more streams, and wherein, if the received signal is generated from two nonbinary codeword symbols, orders of finite fields on which the non-binary codeword symbols are defined are different from each other, and mapping rules in which mapping to the real axis and mapping to the imaginary axis are not independent of each other are applied, then the signal constellation demapper is further configured to:
perform demodulation with respect to an axis on which a coordinate is determined by the non-binary codeword symbol corresponding, to the smaller order among the orders of the finite fields,
select one or more regions from among a plurality of regions divided in advance from the signal constellation based on the received signal, and
demodulate the received signal with respect to the real axis and the imaginary axis in the selected region to calculate the finite-field-symbol-wise LR values or signal-constellation-specific reception probabilities.

16. The apparatus of claim 15, wherein the signal constellation demapper selects the one or more regions comprising a region where the received signal is situated.

17. The apparatus of claim 15, wherein the signal constellation demapper selects the one or more regions comprising a region corresponding to an order that is smaller than the smaller order among the orders of the finite fields.

18. The apparatus of claim 15, wherein the signal constellation is divided into regions of a number that is equal to a result of dividing an order of the signal constellation by the smaller order among the orders of the finite fields.

* * * * *